United States Patent [19]

Madan et al.

[11] Patent Number: 4,868,818

[45] Date of Patent: Sep. 19, 1989

[54] FAULT TOLERANT HYPERCUBE COMPUTER SYSTEM ARCHITECTURE

[75] Inventors: Herb. S. Madan, Marina del Rey; Edward Chow, San Dimas, both of Calif.

[73] Assignee: The United States of America as represented by the Administrator of the National Aeronautics and Space Administration, Washington, D.C.

[21] Appl. No.: 113,956

[22] Filed: Oct. 29, 1987

[51] Int. Cl.$^4$ ........................ G06F 11/20; G06F 11/30

[52] U.S. Cl. .................................. 371/11.3; 364/229.4; 364/267.9; 364/975.5; 364/940.67; 364/942.51; 364/944; 364/944.1; 364/949.4; 371/9.1; 371/62

[58] Field of Search ........................ 371/11, 15, 16, 18, 371/22, 9, 62; 364/200 MS File, 900 MS File

[56] References Cited

PUBLICATIONS

IEEE Micro, Armstrong et al., "A Fault-tolerant Multimicroprocessor-based Computer System for Space--based Signal Processing", Dec. 1984, pp. 54-65.

Communications of the ACM, Seitz, "The Cosmic Cube", Jan. 1985, vol. 28, No. 1, pp. 22-23.

Proc. 1985 Int'l. Conf. on Parallel Processing, Tuazon et al., "Caltech/JPL Mark II, Hypercube Concurrent Processor", Aug. 1985, pp. 666-673.

Proc. 1985 Int'l. Conf. on Parallel Processing, Peterson et al., "The Mark III Hypercube-Ensemble Concurrent Processor", Aug. 1985, pp. 71-73.

Proc. IEEE, Koren et al., "Yield and Performance Enhancement Through Redundancy in VLSI and WSI Multiprocessor Systems", vol. 74, No. 5, May 1986, pp. 699-711.

Primary Examiner—Jerry Smith
Assistant Examiner—Stephen M. Baker
Attorney, Agent, or Firm—Thomas H. Jones; John R. Manning; Charles E. B. Glenn

[57] ABSTRACT

A fault-tolerant multi-processor computer system of the hypercube type comprising a hierarchy of computers of like kind which can be functionally substituted for one another as necessary. Communication between the working nodes is via one communications network while communications between the working nodes and watch dog nodes and load balancing nodes higher in the structure is via another communications network separate from the first. A typical branch of the hierarchy reporting to a master node or host computer (50) comprises, a plurality of first computing nodes (22); a first network of message conducting paths (30) for interconnecting the first computing nodes (22) as a hypercube (28'), the first network (30) providing a path for message transfer between the first computing nodes (22); a first watch dog node (40); and, a second network of message conducting paths (34) for connecting the first computing nodes (22) to the first watch dog node (40) independent from the first network (30), the second network (34) providing an independent path for test message and reconfiguration affecting transfers between the first computing nodes (22) and the first switch watch dog node (40). There is additionally, a plurality of second computing nodes (22); a third network of message conducting paths (30) for interconnecting the second computing nodes (22) as a hypercube (28'), the third network (30) providing a path for message transfer between the second computing nodes (22); a fourth network of message conducting paths (34) for connecting the second computing nodes (22) to the first watch dog node (40) independent from the third network (30) the fourth network (34) providing an independent path for test message and reconfiguration affecting transfers between the second computing nodes (22) and the first watch dog node (40); and, a first multiplexer disposed between the first watch dog node (40) and the second and fourth networks (34) for allowing the first watch dog node (40) to selectively communicate with individual ones of the computing nodes (22) through the second and fourth networks (34); as well as, a second watch dog node (40) operably connected to the first multiplexer whereby the second watch dog node (40) can selectively communicate with individual ones of the computing nodes (22) through the second and fourth networks (34). The branch is completed by a first load balancing node (44); and, a second multiplexer connected between the first load balancing node (44) and the first and second watch dog nodes (40) for allowing the first load balancing node (44) to selectively communicate with individual ones of the first and second watch dog nodes (40).

42 Claims, 7 Drawing Sheets

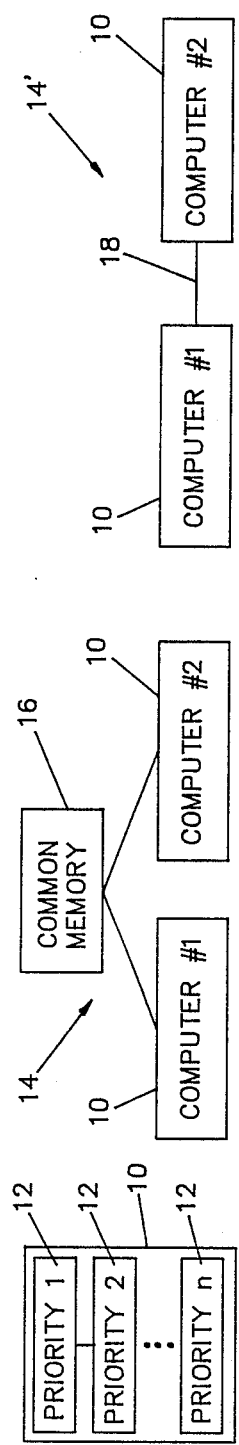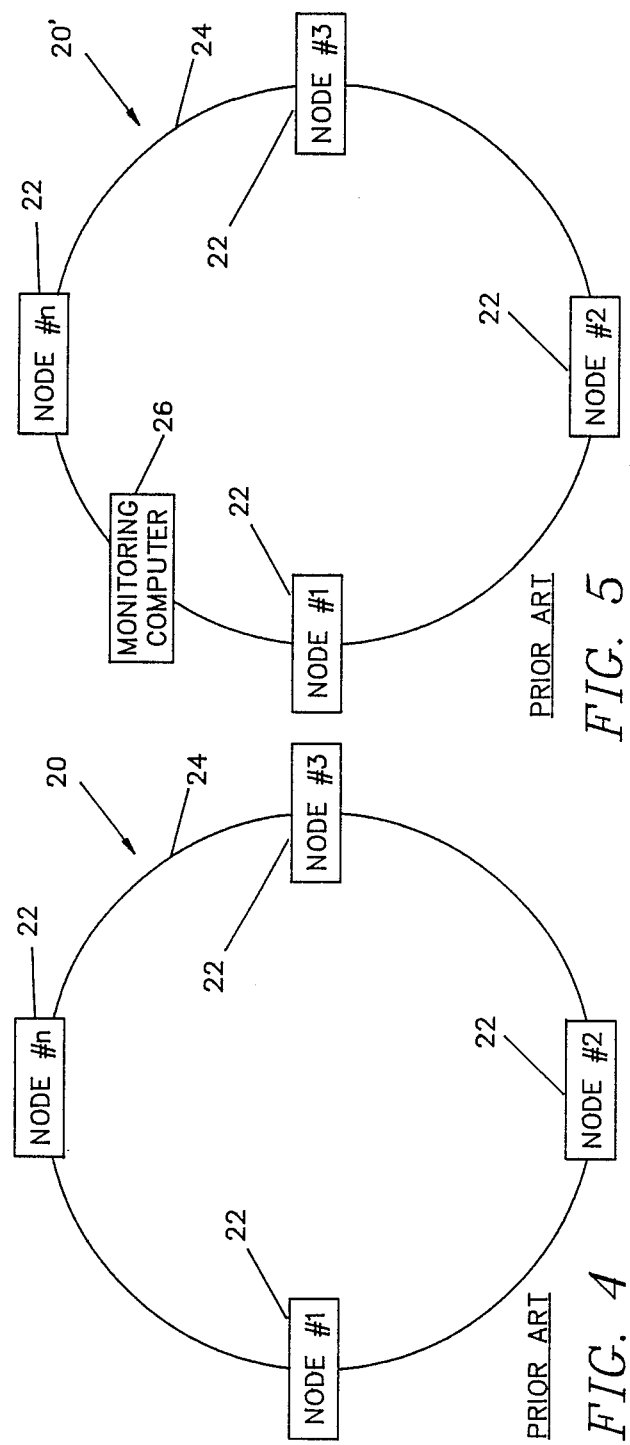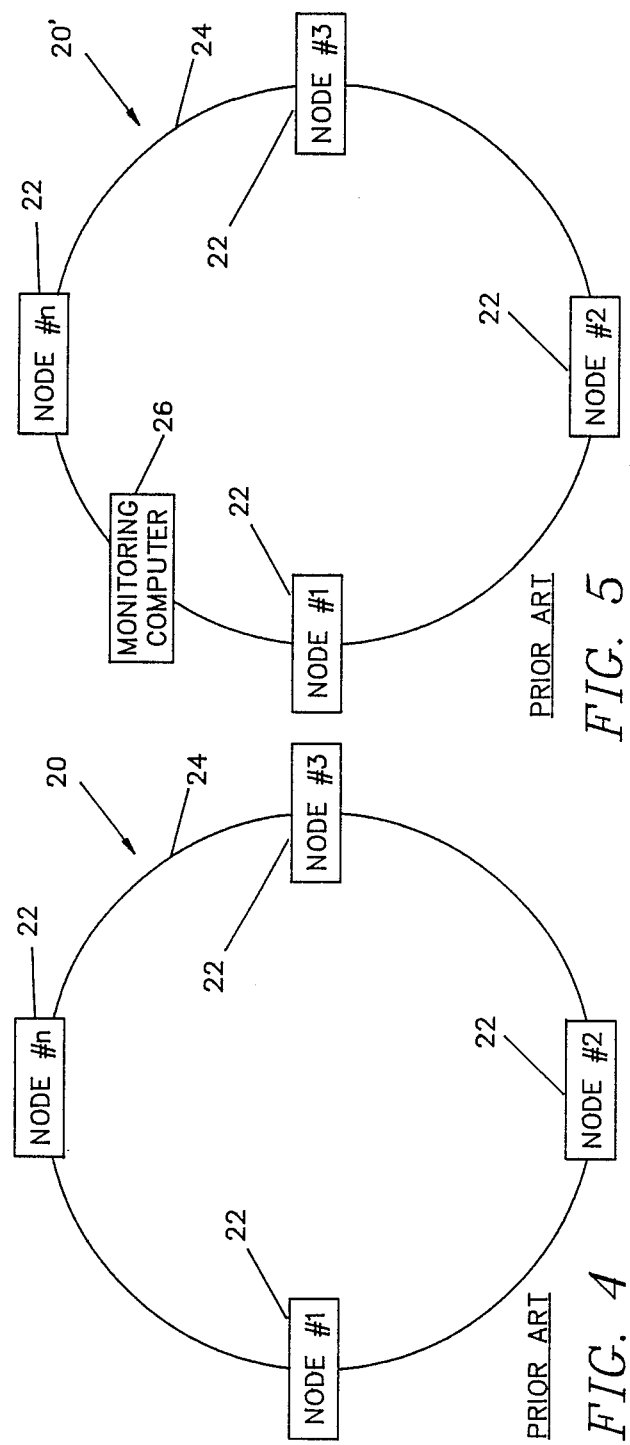

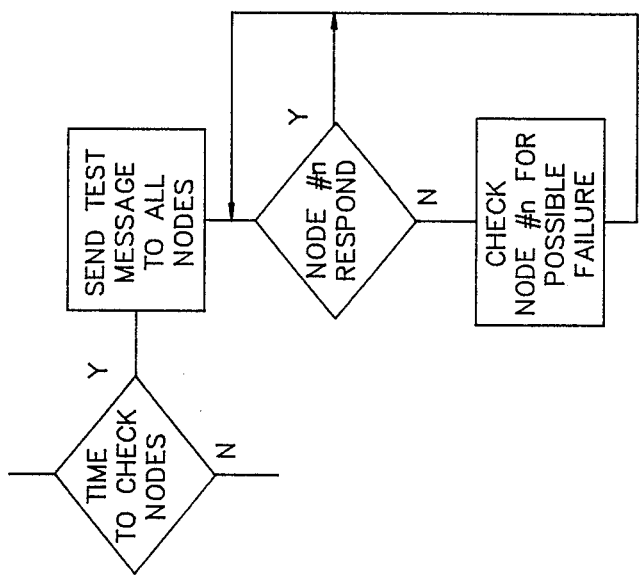
FIG. 16
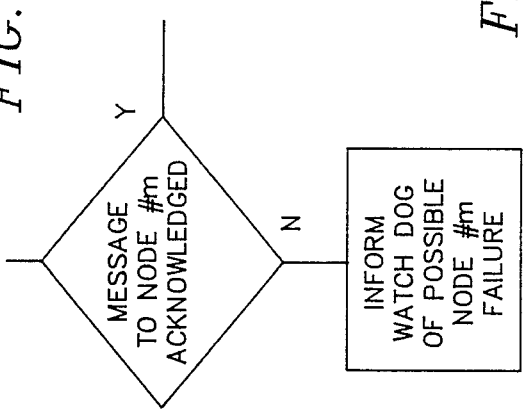
FIG. 17
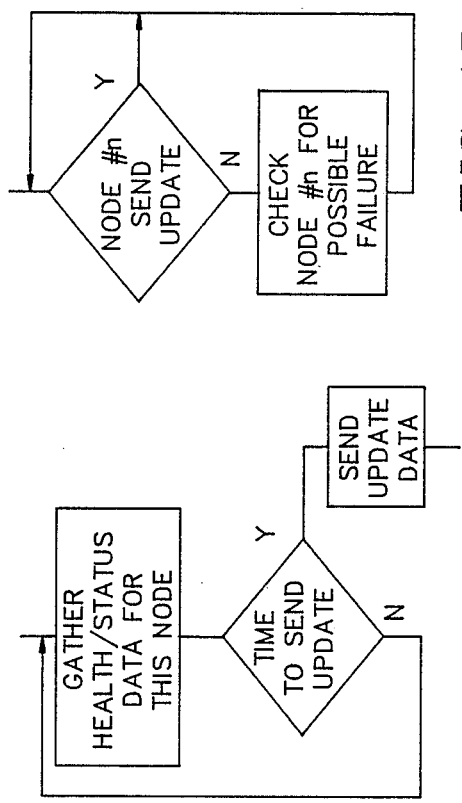
FIG. 15
FIG. 14

FAULT TOLERANT HYPERCUBE COMPUTER SYSTEM ARCHITECTURE

ORIGIN OF THE INVENTION

The invention described herein was made in the performance of work under a NASA contract and is subject to the provisions of Public Law 96-517 (35 USC 202) in which the Contractor has elected not to retain title.

1. Technical Field

The present invention relates to networked computer systems and, more particularly, to a fault-tolerant multi-processor computer system of the hypercube type comprising, a plurality of first computing nodes; a first network of message conducting path means for interconnecting the first computing nodes as a hypercube, the first network providing a path for message transfer between the first computing nodes; a first watch dog node; and, a second network of message conducting path means for connecting the first computing nodes to the first watch dog node independent from the first network, the second network providing an independent path for test message and reconfiguration affecting transfers between the first computing nodes and the first watch dog node.

2. Description of the Prior Art

The first computers were basically batch-processing computers; that is, a computer program was loaded and run to produce the results of calculations performed on data supplied. When the program was complete, the computer stopped. Later, computers began to continuously run a plurality of programs in what appeared to the user to be simultaneous operation. In actuality, the programs were set up on a priority level basis as depicted in FIG. 1 wherein the computing capability of the single computer 10 was timeshared between the programs 12 on a priority basis. As the tasks performed by computers became more involved and complex, the basis multi-processor system 14 of FIG. 2 was developed. By providing a common memory 16 accessible by both computers, the computers could pass messages and data back and forth to one another. By providing redundancy in both computers, critical areas could be covered in the event of a failure of one of the computers. This could be considered as the first approach at fault tolerance; that is, in the event of some minor failures, the computing functions could continue, even if somewhat degraded in performance. This concept was of great importance where the computers were monitoring and/or controlling critical functions such as found in process control and many military applications. As fault-tolerant and multi-processor applications became more commonplace, the shared communications memory was replaced by direct input/output communications links 18 as shown in the multi-processor system 14' of FIG. 3.

More recently, the types of computers produced and the types of applications in which they are employed has lead to the development of network type distributed computing systems such as that indicated as 20 in FIG. 4. So-call Local Area Networks (LANs) within a single plant or complex may have several hundred individual "nodes" 22 (i.e. small computers) interconnected by a communications path such as the "ring" 24 of FIG. 4 employing co-axial cable, optic fibers, microwave, infra red, or combinations thereof. On such networks, the nodes 22 can work individually, can get "services" from other nodes 22, or can be under the control of one or more control computers distributing portions of a common task over the network. This approach has many advantages. In military command and control applications, for example, there are many environments where tracking of a multitude of "targets" must be done simultaneously. If a single "super-computer" is employed, the overhead to accomplish the time sharing becomes burdensome. Not only that, in most cases, the targets fall into a single priority or several groups of common priority level; that is, they all need to be done first. Most importantly, if there is a failure of the computer, the entire mission is lost. On the other hand, having a central authority assign each target to an available node 22 becomes a simple overhead task. With distributed work loads, each node 22 truly operates in parallel with the other nodes such that multiple targets of equal priority can be processed simultaneously. Should a node 22 fail, it is simply replaced by another node 22 on the ring 24.

Obviously, nothing is perfect and you don't get anything for nothing; that is, there must be a quid pro quo. In the case of the networked system, the weak link is the network. Should the network fail, the nodes can no longer communicate with one another or with the distribution managing function. In such case, while all the computing power is working, the computing function virtually grinds to a halt as in the case of the single super-computer when it fails. To this end, very recently, attempts have been made to monitor the health of the network and to reroute around failed communications paths using redundant capabilities provided for the purpose. Such a system is indicated as 20' in FIG. 5, which is a simplified drawing of a system under development by the common assignee of this application. In such a system, a monitoring computer 26 periodically sends test messages to each of the working nodes 22 on the network. The working nodes 22 respond to the test messages along with their other tasks in the normal course. If a response is not received from a working node 22, the monitoring computer 26 has the capability to reroute the network to that node 22 through an alternate path. If the test message is subsequently responded to, a human operator is notified of the network failure so that a correction can be made. If the test message is subsequently not responded to once again, the human operator is notified of the working node failure. While that system is quite effective within its intended environment, the next generation of distributed computing systems as will now be described, do not lend themselves to such as arrangement.

Turning now to FIG. 6, a so-called "hypercube" computer configuration, generally indicated as 28, is shown in which sixteen nodes 22 (individually labelled "0"–"15") are interconnected. The name comes from the cubic arrangement of the interconnections between the nodes 22. As can be seen, in the sixteen node configuration of FIG. 6, there is an eight-cornered "cube" disposed within another eight-cornered cube. In actuality, the nodes need not (and most probably would not) be physically laid out in a cubic configuration. It is just easier to visualize the interconnections which take place when depicted as a cube as in FIG. 6. Thus, within each cube, each node 22 is connected by a communications path 30 to the next three nodes 22 along the "edges" of the cube. For example, node "0" is connected to nodes "4", "1", and "2 " on the inner "cube" while node "8" is connected to nodes "12 ", "9 ", and "10" on the outer cube. Further, each "corner" node 22 of each cube is connected to the adjacent corner node 22 of the next adjacent cube. To continue with the example, therefore, nodes "8" and "0" are interconnected. By continuing cube within cube within cube, it can be realized that hypercubes of substantial size can be assembled. For certain applications, hypercube-based systems employing some 64,000 nodes are presently being contemplated.

As can be appreciated from studying the basic sixteen node hypercube 28 of FIG. 6, the nodes 22 within the hypercube 28 can communicate over various paths; some being direct and some being more complex. For example, node "0" can communicate directly with node "4" over the direct path (i.e. the single communications path 30) linking them together. Should that path be destroyed or unavailable, however, node "0" could go through nodes "1" and "5" and the associated communications paths 30 on the inner cube or through nodes "8" and "12" on the outer cube, for example. More complex paths are, of course, possible, limited only by one's imagination.

While much thought has been given to hypercube theory, nothing has been done to date to apply the principles of fault tolerance, efficient work distribution and redistribution, and "graceful degradation" to the hypercube environment.

DISCLOSURE OF THE INVENTION

This invention is a fault tolerant hypercube computer system architecture. More particularly, it is a fault-tolerant multi-processor computer system of the hypercube type comprising a hierarchy of computers of like kind which can be functionally substituted for one another as necessary. Communication between the working nodes is via a first communications network while communications between the working nodes and watch dog nodes and load balancing nodes higher in the structure is via a second communications network separate from the first. A typical branch of the hierarchy reporting to a master node or host computer comprises, a plurality of first computing nodes; a first network of message conducting path means for interconnecting the first computing nodes as a hypercube, the first network providing a path for message transfer between the first computing nodes; a first watch dog node; and, a second network of message conducting path means for connecting the first computing nodes to the first watch dog node independent from the first network, the second network providing an independent path for test message and reconfiguration affecting transfers between the first computing nodes and the first watch dog node. There is additionally, a plurality of second computing nodes; a third network of message conducting path means for interconnecting the second computing nodes as a hypercube, the third network providing a path for message transfer between the second computing nodes; a fourth network of message conducting path means for connecting the second computing nodes to the first watch dog node independent from the third network, the fourth network providing an independent path for test message and reconfiguration affecting transfers between the second computing nodes and the first watch dog node; and, first multiplexer means disposed between the first watch dog node and the second and fourth networks for allowing the first watch dog node to selectively communicate with individual ones of the computing nodes through the second and fourth networks; as well as, a second watch dog node operably connected to the first multiplexer means whereby the second watch dog node can selectively communicate with individual ones of the computing nodes through the second and fourth networks. The branch is completed by a first load balancing node; and, second multiplexer means connected between the first load balancing node and the first and second watch dog nodes for allowing the first load balancing node to selectively communicate with individual ones of the first and second watch dog nodes.

DETAILED DESCRIPTION OF THE DRAWINGS

FIG. 1 is a simplified drawing depicting a single computer employing a prior art multi-programming priority level structure, to accomplish a plurality of tasks apparently simultaneously.

FIG. 2 is a simplified drawing of a prior art approach to a multi-processor computer system employing a common memory for passing message and data between the computers.

FIG. 3 is a simplified drawing of another prior art approach to a multi-processor computer system employing inter computer communications for passing message and data between the computers.

FIG. 4 is a simplified drawing of a basic loop or ring local area network of computer nodes according to the prior art.

FIG. 5 is a simplified drawing of a basic loop or ring local area network of computer nodes as in FIG. 4 with a network health monitoring system according to the prior art incorporated therein.

FIG. 14 is a simplified flow diagram of logic incorporated within the health management function of the watch dog nodes in the present invention.

FIG. 15 is a simplified flow diagram of logic incorporated within the health management function of the watch dog nodes in the present invention.

FIG. 16 is a simplified flow diagram of logic incorporated within the health management function of the watch dog nodes in the present invention.

FIG. 17 is a simplified flow diagram of logic incorporated within the health management function of the working nodes in the present invention.

DETAILED DESCRIPTION OF THE INVENTION

Figure 6:
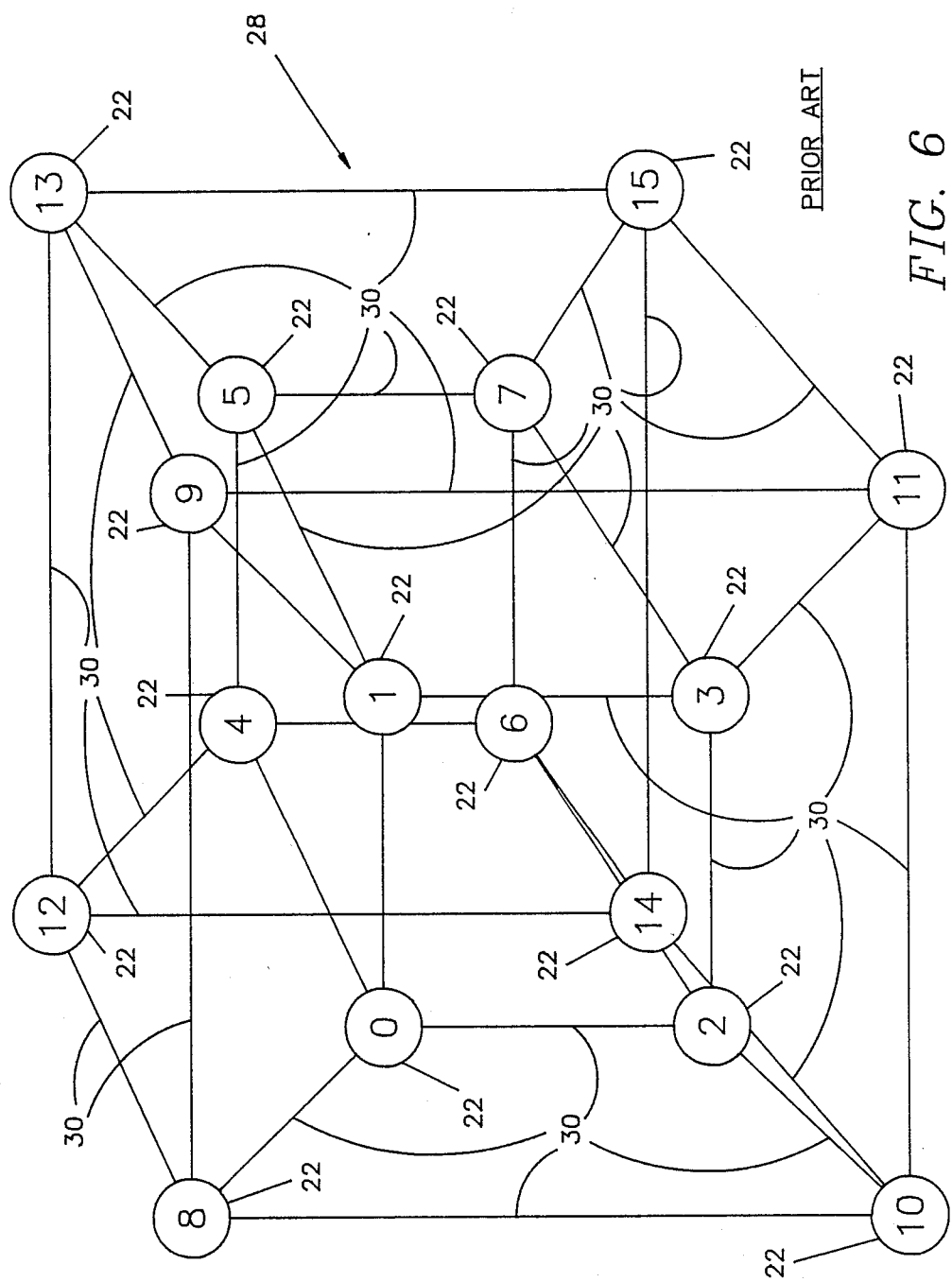
FIG. 6 is a simplified drawing of a prior art hypercube computer system architecture.
Figure 7:
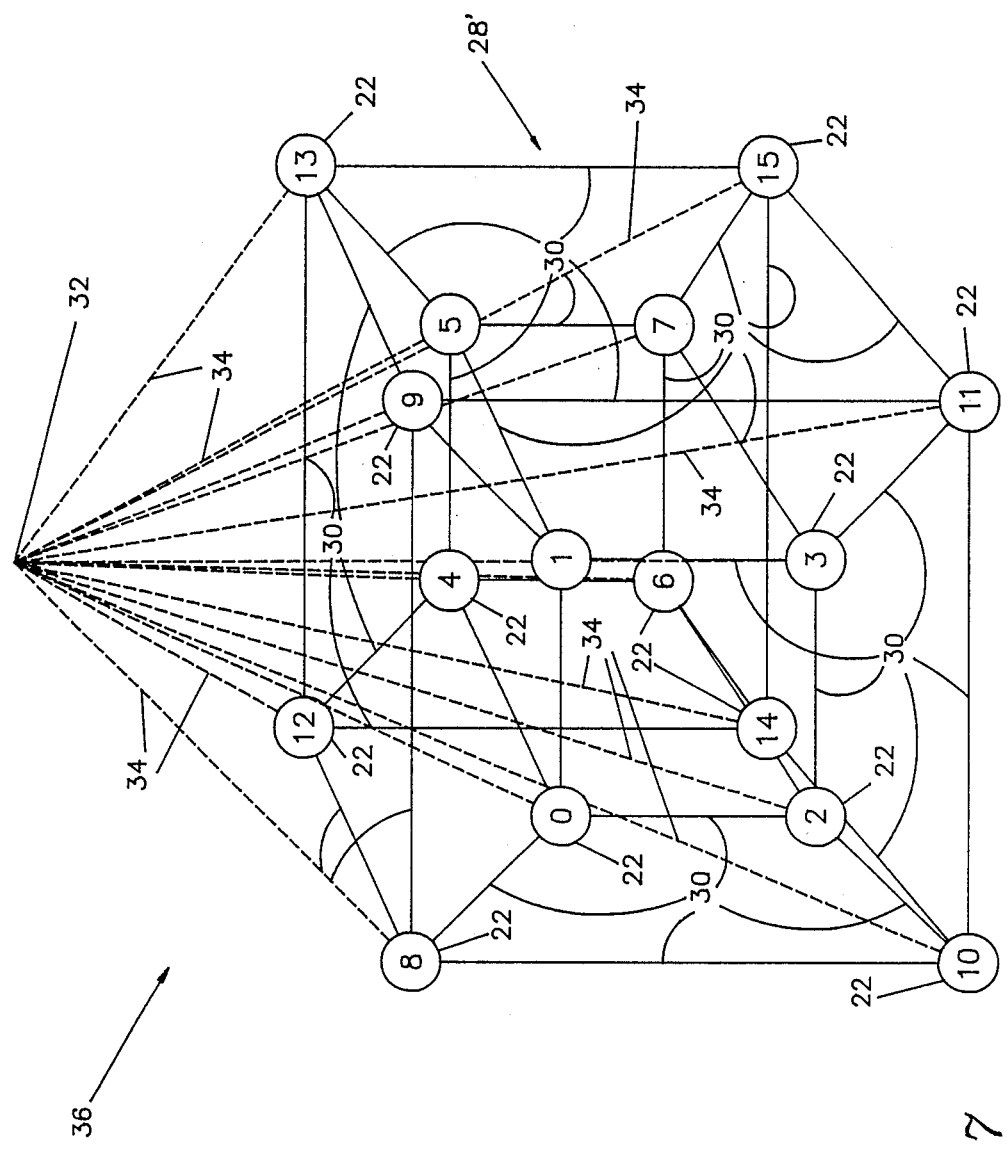
FIG. 7 is a simplified drawing showing the hypercube structure of FIG. 6 modified to be incorporated into the fault tolerant hypercube-based computer architecture of the present invention.

The first point of deviation in the present invention over the prior art is shown in FIG. 7 where the sixteen node hypercube 28 of FIG. 6 has been modified to act as a subcube 28' within a much larger hypercube (to be described shortly) comprised of a multitude of subcubes 28'. As shown in FIG. 7, each subcube 28' has each of the nodes 22 thereof separately connected to a reference point 32 by a separate communications path 34 which is part of a separate communications network, generally indicated as 36, used to monitor and control the health of the total architecture in a manner to be described shortly. At this point, it is important to recognize that, contrary to the approach of the prior art as described earlier wherein the same network is used for all functions, in the present invention, messages between the working nodes 22 comprising the hypercube employ the communications paths 30 comprising a first network while the other functions which are unique to the present invention employ the second network 36 for purposes which should become obvious from the description which follows hereinafter. It should also be pointed out at this time that the switching of nodes and communications paths which takes place within the present invention is made possible in a preferred manner through the use of a unique switching technology which is the subject of a co-pending application also assigned to the assignee of the present invention. That co-pending application entitled METHOD AND APPARATUS FOR ELIMINATING UNSUCCESSFUL TRIES IN A SEARCH TREE, Ser. No. 96,722, filed Aug. 17, 1987. Reference should be made thereto to obtain a detailed description of that switching technology, which is the preferred switching technology for incorporation into the present invention.

Figure 8:
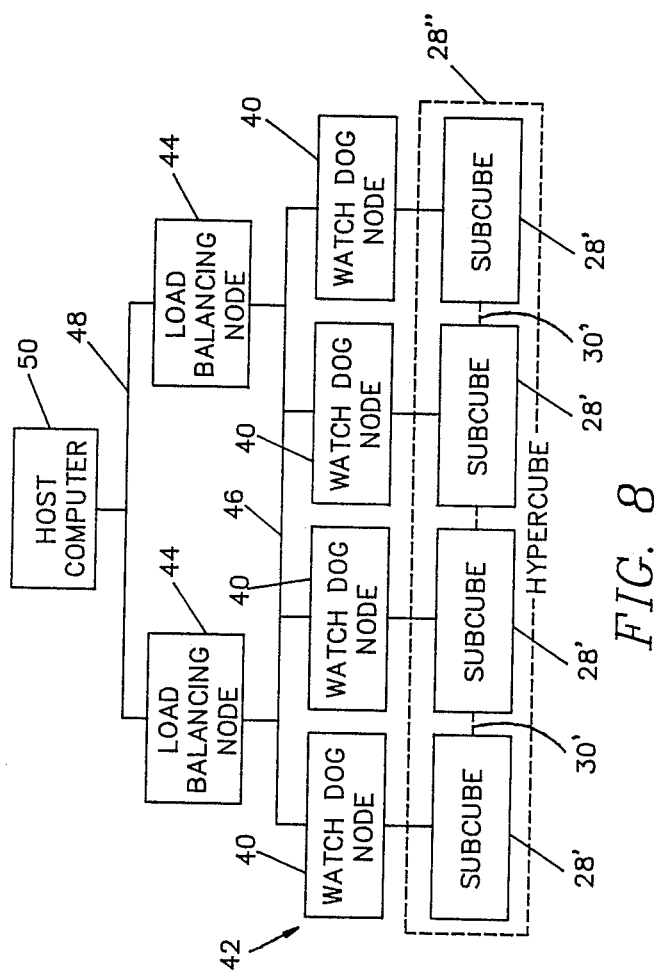
FIG. 8 is a simplified block diagram of the fault tolerant hypercube-based computer architecture of the present invention.

A computer system architecture based on hypercube technology according to the present invention is shown in simplified block diagram form in FIG. 8 and generally indicated therein as 38. As those skilled in the art will recognize and appreciate, the system 38 of FIG. 8 to be described in detail hereinafter is representative only and not limiting. There are certain novel attributes thereof which form the essence of the present invention and which will become apparent from the detailed description.

According to the present invention, a plurality of individual subcubes 28', such as those in FIG. 7, are interconnected with the above-referenced co-pending switching technology to comprise the entire hypercube 28"; that is, the hypercube 28" is comprised of the subcubes 28' interconnected by a unique interconnection network. Additional capabilities are connected to the hypercube 28" through the communications networks 36 to provides the capabilities for fault tolerance, work distribution and redistribution, graceful degradation, and the like.

Before actual description is undertaken, a moment should be spent understanding some of the problems to be solved by a fault tolerant hypercube computer system architecture. There are two basic entities which must be considered —messages and work. As the individual nodes comprising the system 38 generate data, results, etc., they put them in the form of messages which are sent to other entities in the system over the communications paths 30. This is not unlike the ring-based system 20 of FIG. 4 in which the nodes 22 send messages back and forth to one another along the ring 24. Each working node 22 within the subcubes 28' of the system 38 also has work assigned to it to do. Ideally, all messages sent are received by their designated recipient(s) without problem. Ideally also, the work is equally distributed to all the nodes 22 comprising the system 38. As those skilled in the art can readily appreciate, the ideal is never the actual. As mentioned earlier, a fault tolerant system must make provision for the case where a message sent is not received. There are additional considerations which should be taken into account as well, particularly in a hypercube system of the magnitude under consideration. Acknowledgement techniques are known in the art wherein the recipient of a message sends a message back to the sender acknowledging receipt. Timeout checking schemes are also known in the art wherein the sender sets a clock upon sending a message and takes some sort of corrective action if a response has not been received upon timeout of the clock. Such techniques prevent the system or individual nodes from being "hung" waiting for a response which will never come. But how about messages which have been received and acknowledged and then the handling node becomes inoperative? And, what about messages travelling over complex paths throughout the system with high associated overhead which could be rerouted to shorter paths? In a system with many hundreds or thousands of interconnected nodes, this is a potentially important consideration. The same applies to the assigned workload for the various nodes. When a node becomes inoperative or overloaded, where, when, and how will its prior duties be reassigned? Where tasks are being assigned from node to node, there is also the problem of where messages should be directed, i.e. how do you address the recipient when you don't know physically who that recipient is to be? All these considerations, and others, have been incorporated into the system of the present invention in order to provide a maximized capability to provide the objectives desired.

Returning to FIG. 8, it can be seen that the system 32 is functionally divided on several levels. At the lowest level, there are the plurality of subcubes 28'. Each subcube 28' is a hypercube structure such as shown in FIG. 7 wherein individual nodes 22 are interconnected by the cubic network of communications paths 30 over which the messages between the nodes 22 are sent. The communications paths 30 of the subcubes 28' are interconnected by communications paths 30', as indicated by the dotted lines so numbered, so that the messages between the nodes 22 of the various subcubes 34 can travel throughout the entire hypercube 28' of the system 32. A major difference in the system of the present invention over prior art fault tolerant systems takes place at this point. The health and reconfiguration of the system 32 is *not* accomplished over the network comprised of the communications paths 30, 30'. Rather, this function is accomplished over the separate network 36 of dedicated communications paths 34. In the system 38 of the present invention in its most basic representation as shown in FIG. 7, each subcube 28' has a watch dog node 40 connected to the reference point 32 of the associated communications network 36. In this way, each watch dog node 40 can communicate with each of the working nodes 22 within the subcube 28' to which it is attached and for which it is primarily responsible. The watch dog nodes 40 are, in turn, grouped into subgroups 42. Each watch dog node 40 within the subgroups 42 is connected to the other watch dog nodes in its own and the other subgroups 42 and to a load balancing node 44 by a network comprising communications paths 46. The load balancing nodes 44 are, in turn, connected by a network of communications paths 48 to each other and a host computer 50 which has overall responsibility for the functioning and operation of the system 38.

Figure 10:
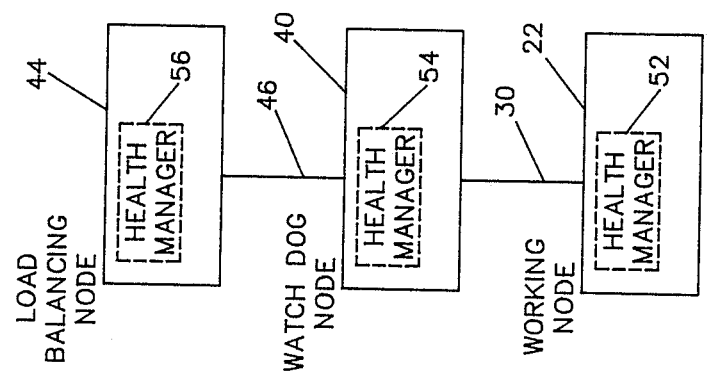
FIG. 10 is a simplified block diagram showing the inclusion of health management functions within each level of the hypercube-based computer architecture of the present invention.

Turning now to FIG. 10, an important aspect of the present invention which aids in its ability to achieve its objective is shown in very simplified form. The system 38 is divided into hierarchies as shown in the Figure extending between the working nodes 22 on the bottom level to the load balancing nodes 44 on the top level (ignoring the host computer 50 which is generally administrative in nature only). Each level of the hierarchy (i.e. the working nodes 22, the watch dog nodes 40, and the load balancing nodes 44) includes health manager logic 52, 54, 56, respectively, for accomplishing the objectives of the present invention. This aspect will now be described in greater detail.

Figure 11:
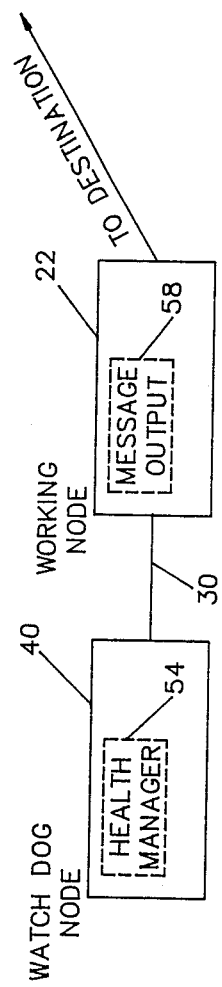
FIG. 11 is a simplified block diagram showing how messages in the computer architecture of the present invention are sent simultaneously to both the destination and the cognizant watch dog node.
Figure 9:
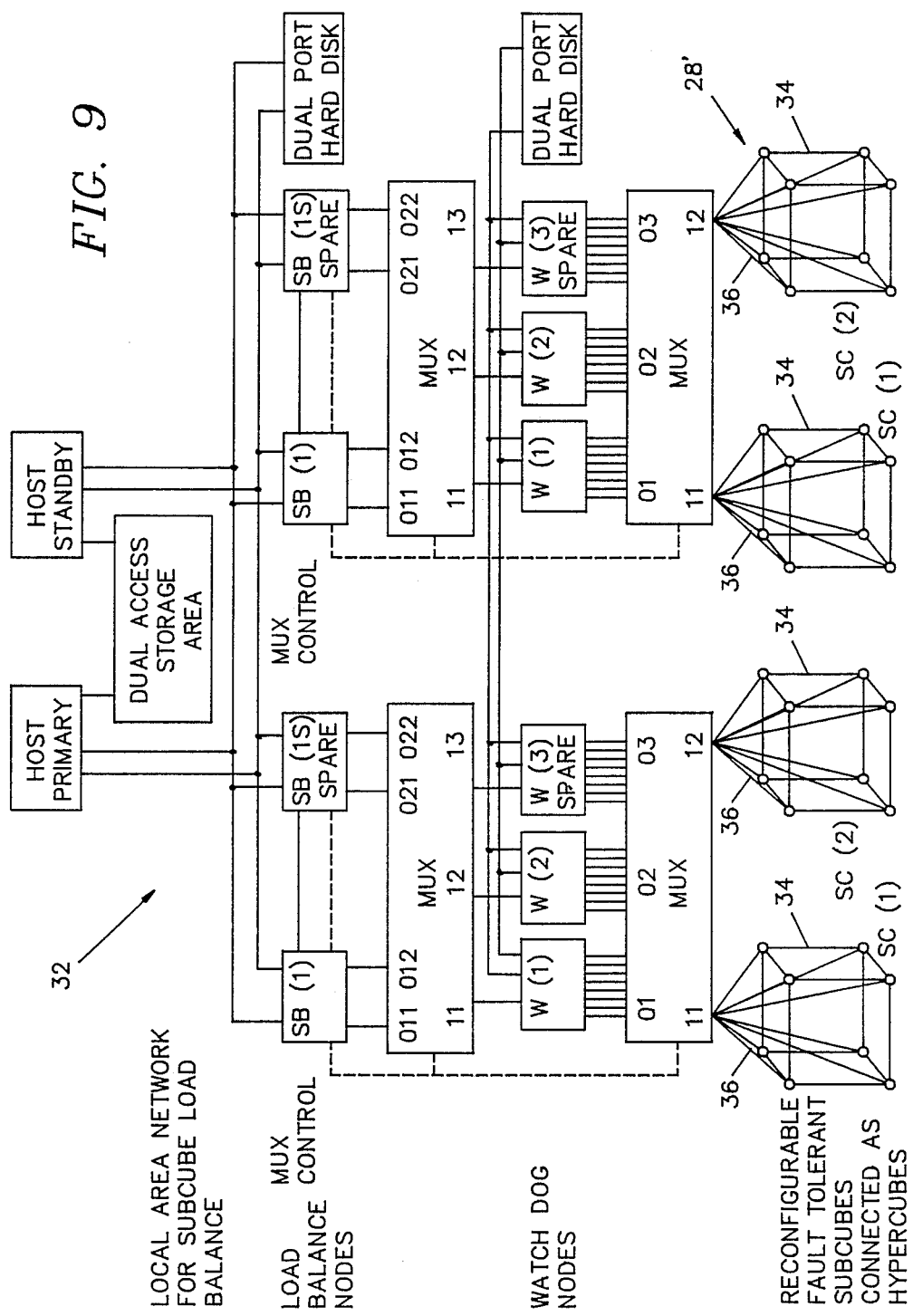
FIG. 9 is a more detailed drawing of the fault tolerant hypercube-based computer architecture of the present invention.

As a first major aspect of the present invention which is contrary to the prior art, all messages from the message output logic 58 of the working nodes 22 are also sent to the health manager logic 54 of the cognizant watch dog node 40 as depicted in FIG. 11. Likewise, completion of a message is also advised to the health manager logic 54 as well as being employed internally within the working node 22 for its own bookkeeping functions. This is of vital importance in the event that a working node 22 goes down or is reassigned. In the usual prior art approach, reference to messages in progress can be unreachable in such instances. Thus, even though work is rescheduled to another working node, the messages in progress could be lost, along with the associated work dependant thereon. In the fault tolerant hypercube-based system 38 of the present invention, the watch dog nodes 40 and the load balancing nodes 44 are of the same basis computer type as the working nodes 22 comprising the subcubes 28'. Accordingly, they are in a position and of a capability to assume the functions and responsibilities of a working node 22 prior to and during the changeover/reassignment of a node 22. By having the messages in progress for each of the nodes accessible by the watch dog nodes 40, one of the watch dog nodes 40 can immediately take over for a disabled node while corrective action is taken. Once task reassignment has been accomplished to a new working node 22, the appropriate watch dog node 40 need only turn over responsibility to that new node for the associated task assignments to continue virtually uninterrupted. The messages in progress previously assigned to and associated with the old working node 22 (and not completed by the watch dog node 40) are simply now assigned to and associated with the new working node 22.

Figure 12:
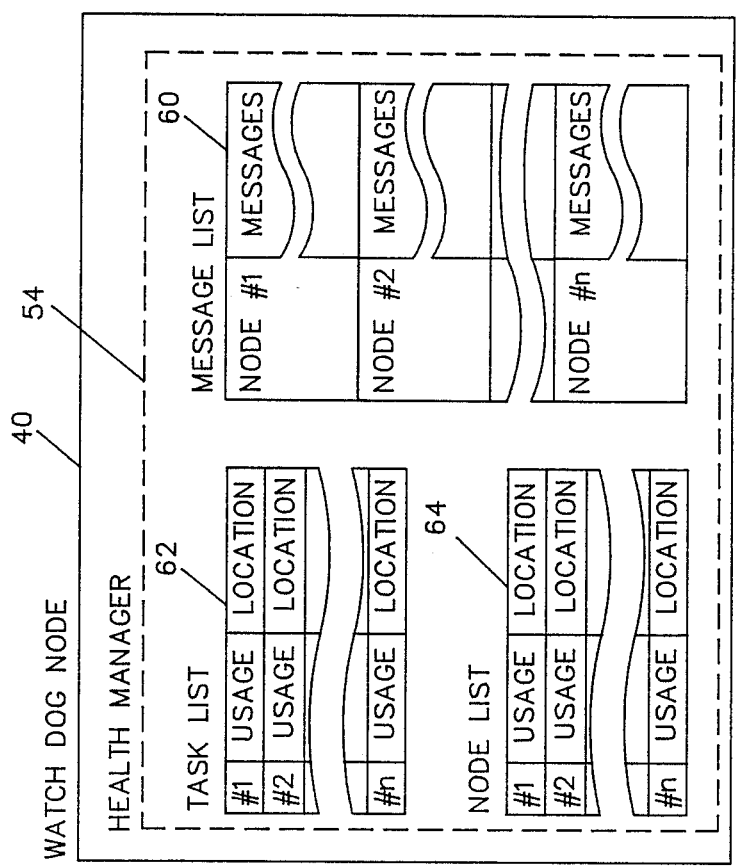
FIG. 12 is a simplified block diagram showing some of the lists employed by the health manager of the watch dog nodes in the present invention.

In this latter regard, the present invention envisions the health manager logic 54 of the watch dog nodes 40 each including certain dynamic lists as shown in simplified form in FIG. 12. As well known to those skilled in the art, the form of such lists can be varied depending on different factors such as the computer and language used, and the like. Consequently, the lists described herein are shown in simplified form and by way of being representative only and are not intended to be limiting in any way. For example, at 60 is a message list comprising the messages in progress for each of the nodes 22 as discussed above. Each watch dog node health manager logic 54 would also keep some form of a task list 62 and a node list 64 by means of which the status of the working nodes 22 and the tasks being accomplished by them can be continually monitored and reassigned as necessary. For example, the task list 62 could provide information that a certain task located in a certain node 22 is occupying a majority of its time while another task presently assigned to another node 22 is taking up very little computing time. By reassignment of the tasks, the watch dog node 40 may be able to put both nodes 22 on a par working well within their respective capacities. Likewise, the node list 64 would be required to ascertain which physical node 22 is performing as a particular addressable node, the amount of time being occupied by that node in accomplishing tasks (100% being the maximum practical), and which nodes are down or out of service.

Figure 13:
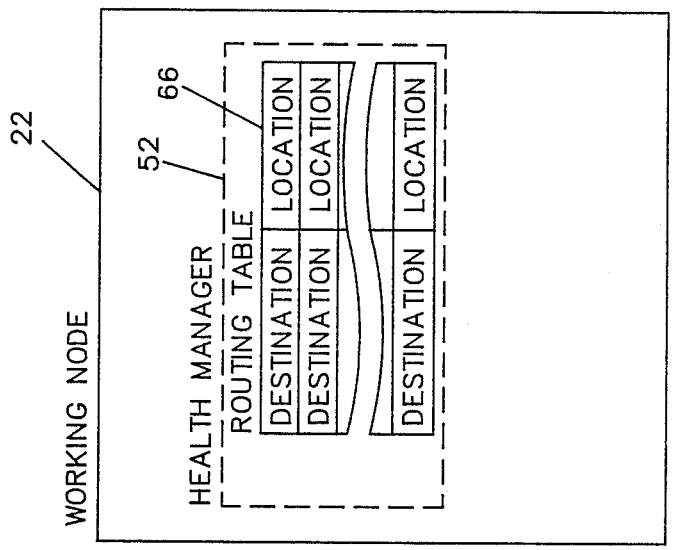
FIG. 13 is a simplified block diagram showing the routing table maintained within each working node in the present invention.

Another important aspect of the present invention with respect to the accomplishment of its stated objectives is shown in simplified form in FIG. 13. As depicted therein, it is preferred that each of the working nodes 22 include a routing table 66 within the health manager logic 52. This routing table 66 would be maintained (directly or indirectly) by the health manager logic 54 of the watch dog nodes 40. The intent is to cut down overhead associated with a dynamic environment wherein the ultimate destination for messages could be changing. The routing tables 66 would contain the various destinations in symbolic (i.e. node independent) form along with the present node dependent location assigned to that destination. Thus, by sending messages destination assigned via the entries of the routing table 66, each node 22 can immediate send its messages without the overhead associated with a central lookup table. The watch dog nodes 40 could either update the routing tables 66 directly upon reassignment of a destination or by sending reassignment messages to the various nodes 22 and allowing them to each update their own routing table 66. The latter approach is preferred since dual access to common memory considerations are avoided thereby.

As should be appreciated from a consideration of the foregoing, the watch dog nodes 40 are in a position to oversee the task and message status and health of the working nodes 22 comprising the subcubes 28' in particular and the hypercube 28" in general. Each watch dog node 40 is primarily responsible for the assignment of tasks within its directly connected subcube 28' so as to maximize usage of the subcube 28' and minimize message traffic. Note, however, that the watch dog nodes 40 have the ability to communicate with one another to best accomplish their respective tasks. Thus, for example, if one watch dog node 40 finds that there is a high volume of message traffic to a destination in another subcube 28' it might be in the best interests of overall performance to transfer certain tasks into and/or out of its own subcube 28'. While it would be possible to have the watch dog nodes 40 accomplish this between themselves, the load balancing nodes 44 are including for that very purpose and to relieve the watch dog nodes 40 of such system-wide responsibility. The load balancing nodes 44 include logic and the ability to access the various tables and lists of the watch dog nodes 40 (along with appropriate tables and lists of their own) so as to perform such functions as described above. Thus, in the example shown, the load balancing node 44 of direct responsibility may request the appropriate watch dog nodes 40 to reassign tasks and/or destinations so as to result in the message traffic between subcubes to be replaced by message traffic over a shorter path within the same subcube.

In addition to the above-described responsive actions on the part of the watch dog nodes 40 and the load balancing nodes 44, it is anticipated that both active and passive failure investigation will be undertaken within the system 38 of the present invention. FIGS. 14–17 contain simplified representative logic such as could be included in both the watch dog nodes 40 (primarily) and load balancing nodes 44 (supplementally) to achieve these purposes. As represented by FIG. 14, it is anticipated that health management logic 52 of the working nodes 22 will periodically send health/status data, as gathered, calculated, and accumulated, to the responsible watch dog node 40 and that the health manager logic 54 of the watch dog nodes 40 will do likewise to its associated load balancing node 44. The health manager logic 54, 56, of the watch dog and load balancing nodes 40, 44 will, correspondingly, include logic as represented by FIG. 15 checking for such periodic health/status data updates. Should any node 22, 40 fail to timely provide its update, the responsible node 40, 44 will then check to see if there has been a node failure and take appropriate corrective action.

In addition to the above-described passive actions, it is also anticipated that the health manager logic 54, 56 of the watch dog and load balancing nodes 40, 44 will actively search out failed node by incorporating logic such as that represented by FIG. 16. As depicted therein, test messages will be sent periodically to all the nodes 22, 40 requiring a response indicating continued proper operation. Such messages may also be sent to ascertain node operative status in the event of a passive test indicating possible failure of the node. Failure to receive a timely response to such a test message will be indicative of node failure and cause an appropriate node and task reassignment to be initiated.

Finally, it is anticipated that each of the working nodes 22 will include logic such as that represented by FIG. 17 within its health manager logic 52. As indicated therein, some of the checking of the working nodes 22 will be accomplished by the nodes 22 themselves on a dynamic basis; that is, when a node "n" sends a message to another node "m" and fails to get a timely response thereto, node "n" will inform its associated watch dog node 40 that there is a possible failure of node "m" which should be checked by the above-described active testing procedure.

We claim:

1. A fault-tolerant multi-processor computer system of the hypercube type comprising:
   (a) a plurality of first computing nodes;
   (b) a first network of message conducting path means for interconnecting said first computing nodes as a hypercube, said first network providing a path for message transfer between said first computing nodes;
   (c) a first watch dog node; and,
   (d) a second network of message conducting path means for directly connecting each of said first computing nodes to said first watch dog node independent from said first network, said second network providing an independent path for test message and reconfiguration affecting transfers between respective ones of said first computing nodes and said first watch dog node.

2. The fault-tolerant multi-processor computer system of claim 1 and additionally comprising:
   (a) a plurality of second computing nodes;
   (b) a third network of message conducting path means for interconnecting said second computing nodes as a hypercube, said third network providing a path for message transfer between said second computing nodes;
   (c) a fourth network of message conducting path means for directly connecting each of said second computing nodes to said first watch dog node independent from said third network, said fourth network providing an independent path for test message and reconfiguration affecting transfers between respective ones of said second computing nodes and said first watch dog node; and,
   (d) first multiplexer means disposed between said first watch dog node and said second and fourth networks for allowing said first watch dog node to selectively communicate directly with individual ones of said computing nodes through said second and fourth networks.

3. The fault-tolerant multi-processor computer system of claim 2 and additionally comprising:
   a second watch dog node operably connected to said first multiplexer means whereby said second watch dog node can selectively communicate directly with individual ones of said competing nodes through said second and fourth networks.

4. The fault-tolerant, multi-processor computer system of claim 3 and additionally comprising:
   (a) a first load balancing node; and
   (b) second multiplexer means connected between said first load balancing node and said first and second watch dog nodes for allowing said first load balancing node to selectively communicate directly with individual ones of said first and second watch dog nodes.

5. The fault-tolerant multi-processor computer system of claim 4 and additionally comprising:
   thirteenth logic means in said first load balancing node for causing said first load balancing node to perform the tasks assigned to said first and second watch dog nodes when they are disabled using the messages in said first data storage means as necessary.

6. The fault-tolerant multi-processor computer system of claim 4 and additionally comprising:
   fourteenth logic means in said first load balancing node for evaluating the task loading of said first and second watch dog nodes and their associated said computing nodes and for reassigning tasks from one of said watch dog nodes which is overburdened to the other of said watch dog nodes which is less burdened.

7. The fault-tolerant multi-processor computer system of claim 4 and additionally comprising:
   (a) a plurality of third computing nodes;
   (b) a fifth network of message conducting path means for interconnecting said third computing nodes as a hypercube, said fifth network providing a path for message transfer between said third computing nodes;
   (c) a third watch dog node;
   (d) a sixth network of message conducting path means for directly connecting each of said third computing nodes to said third watch dog node independent from said fifth network, said sixth network providing an independent path for test message and reconfiguration affecting transfers between respective ones of said third computing nodes and said third watch dog node;
(e) a plurality of fourth computing nodes;
(f) a seventh network of message conducting path means for interconnecting said fourth computing nodes as a hypercube, said seventh network providing a path for message transfer between said fourth computing nodes;
(g) an eighth network of message conducting path means for directly connecting each of said fourth computing nodes to said third watch dog node independent from said seventh network, said eighth network providing an independent path for test message and reconfiguration affecting transfers between respective ones of said fourth computing nodes and said third watch dog node;
(h) third multiplexer means disposed between said third watch dog node and said sixth and eighth networks for allowing said third watch dog node to selectively communicate directly with individual ones of said third and fourth computing nodes through said sixth and eighth networks;
(i) a fourth watch dog node operably connected to said third multiplexer means whereby said fourth watch dog node can selectively communicate directly with individual ones of said third and fourth computing nodes through said sixth and eighth networks;
(j) a second load balancing node; and,
(k) fourth multiplexer means connected between said second load balancing node and said third and fourth watch dog nodes for allowing said second load balancing node to selectively communicate directly with individual ones of said third and fourth watch dog nodes.

8. The fault-tolerant multi-processor computer system of claim 1 and additionally comprising:
a first logic means in each of said first computing nodes for sending a copy of each message sent from one of said first computing nodes to another of said first computing nodes over said first network of message conducting path means to said first watch dog node over said second network of message conducting path means.

9. The fault-tolerant multi-processor computer system of claim 8 and additionally comprising:
second logic means in each of said first computing nodes for sending a copy of each acknowledgement of message handling competition sent from one of said first computing nodes to another of said first computing nodes over said first network of message conducting path means to said first watch dog node over said second network of message conducting path means.

10. The fault-tolerant multi-processor computer system of claim 9 and additionally comprising:
first data storage means in each of said first watch dog nodes for saving said copy of each message received from one of said first computing nodes until the associated said copy of acknowledgement of message handling completion is received.

11. The fault-tolerant multi-processor computer system of claim 10 and additionally comprising:
second data storage means in each said first watch dog node for listing the tasks assigned to each of said first computing nodes for execution.

12. The fault-tolerant multi-processor computer system of claim 11 and additionally comprising:
fourth logic means in said first watch dog node for evaluating the task loading of said first computing nodes and for reassigning tasks from ones of said first computing nodes which are task overburdened to others of said first computing nodes which are being under utilized.

13. The fault-tolerant multi-processor computer system of claim 11 and additionally comprising:
third logic means in said first watch dog node for causing said first watch dog node to perform the tasks assigned to a first computing node which is disabled using the messages in said first data storage means.

14. The fault-tolerant multi-processor computer system of claim 13 and additionally comprising:
eighth logic means in said first watch dog node for after initialization periodically and continuously sending test messages to each of said first computing nodes and for treating a said first computing node as disabled if it fails to respond to a said test message.

15. The fault-tolerant multi-processor computer system of claim 13 and additionally comprising:
(a) ninth logic means in each of said first computing nodes for after initialization periodically and continuously gathering and sending status reports on itself to said first watch dog node; and
(b) tenth logic means in said first watch dog node for treating a said first computing node as disabled if it fails to send a said status report.

16. The fault-tolerant multi-processor computer system of claim 13 and additionally comprising:
(a) eleventh logic means in each of said first computing nodes for informing said first watch dog node if it fails to complete a communication with another of said first computing nodes; and,
(b) twelfth logic means in said watch dog node for sending an extra said test message to said another of said first computing nodes in response to said being informed to determine if said failure to complete a communication was due to said node's being disabled.

17. A fault-tolerant multi-processor computer system of the hypercube type comprising:
(a) a plurality of first computing nodes;
(b) a plurality of second computing nodes;
(c) a plurality of third computing nodes;
(d) a plurality of fourth computing nodes;
(e) a first network of message conducting path means for interconnecting said first computing nodes as a hypercube, said first network providing a path for message transfer between said first computing nodes;
(f) a second network of message conducting path means for interconnecting said first computing nodes as a hypercube, said second network providing a path for message transfer between said second computing nodes;
(g) a third network of message conducting path means for interconnecting said third computing nodes as a hypercube, said third network providing a path for message transfer between said third computing nodes;

(h) a fourth network of message conducting path means for interconnecting said fourth computing nodes as a hypercube, said fourth network providing a path for message transfer between said fourth computing nodes;

(i) a first watch dog node;

(j) a second watch dog node;

(k) a third watch dog node;

(l) a fourth watch dog node;

(m) a fifth network of message conducting path means for directly connecting each of said first computing nodes to said first watch dog node independent from said first network, said fifth network providing an independent path for test message and reconfiguration affecting transfers between respective ones of said first computing nodes and said first watch dog node;

(n) a sixth network of message conducting path means for directly connecting each of said second computing nodes to said second watch dog node independent from said second network, said sixth network providing an independent path for test message and reconfiguration affecting transfers between respective ones of said second computing nodes and said second watch dog node;

(o) a seventh network of message conducting path means for directly connecting each of said third computing nodes to said third watch dog node independent from said third network, said seventh network providing an independent path for test message and reconfiguration affecting transfers between respective ones of said third computing nodes and said third watch dog node;

(p) an eighth network of message conducting path means for directly connecting each of said fourth computing nodes to said fourth watch dog node independent from said fourth network, said eighth network providing an independent path for test message and reconfiguration affecting transfers between respective ones of said fourth computing nodes and said fourth watch dog node;

(q) first multiplexer means disposed between said first and second watch dog nodes and said fifth and sixth networks for allowing said first and second watch dog nodes to selectively communicate directly with individual ones of said first and second computing nodes through said fifth and sixth networks;

(r) second multiplexer means disposed between third and fourth watch dog nodes and said seventh and eighth networks for allowing said third and fourth watch dog nodes to selectively communicate directly with individual ones of said third and fourth computing nodes through said seventh and eighth networks;

(s) a first load balancing node;

(t) a second load balancing node;

(u) third multiplexer means connected between said first load balancing node and said first and second watch dog nodes for allowing said first load balancing node to selectively communicate directly with individual ones of said first and second watch dog nodes;

(v) fourth multiplexer means connected between said second load balancing node and said third and fourth watch dog nodes for allowing said second load balancing node to selectively communicate directly with individual ones of said third and fourth watch dog nodes;

(w) a host computer; and (x) a ninth network of message conducting path means connecting said host computer to said first and second load balancing nodes for providing an independent path for message transfer between said host computer, said first load balancing node and said second load balancing node.

18. The fault-tolerant multi-processor computer system of claim 17 and additionally comprising:

first logic means in each of said computing nodes for sending a copy of each message sent from one of said computing nodes to another of said computing nodes over said first, second, third and fourth networks of message conducting path means to said watch dog nodes over said fifth, sixth, seventh and eighth networks of message conducting path means.

19. The fault-tolerant multi-processor computer system of claim 18 and additionally comprising:

a second logic means in each of said computing nodes for sending a copy of each acknowledgement of message handling completion sent from one of said computing nodes to another of said computing nodes over said first, second, third and fourth networks of message conducting path means to said watch dog nodes over said fifth, sixth, seventh and eighth networks of message conducting path means.

20. The fault-tolerant multi-processor computer system of claim 19 and additionally comprising:

first data storage means in each of said watch dog nodes for saving said copy of each message received from one of said computing nodes until the associated said copy of acknowledgement of message handling completion is received.

21. The fault-tolerant multi-processor computer system of claim 17 and additionally comprising:

second data storage means in each of said watch dog nodes for listing tasks assigned to said computing nodes for execution.

22. The fault-tolerant multi-processor computer system of claim 21 and additionally comprising:

fourth logic means in said watch dog nodes for evaluating the task loading of said computing nodes and for reassigning tasks from ones of said computing nodes which are task overburdened to others of said computing nodes which are being under utilized.

23. The fault-tolerant multi-processor computer system of claim 21 and additionally comprising:

third logic means in said watch dog nodes for causing said watch dog node to perform the tasks assigned to a said computing node which is disabled using the messages in said first data storage means.

24. The fault-tolerant multi-processor computer system of claim 23 wherein:

said watch dog nodes include logic for after initialization periodically and continuously sending test messages to each of said computing nodes and for treating a said computing node as disabled if it fails to respond to a said test message.

25. The fault-tolerant multi-processor computer system of claim 23 wherein:

(a) each said computing node includes logic for after initialization periodically and continuously gathering an sending status reports on itself to a said watch dog node to which it is assigned; and, (b) said watch dog nodes include logic for treating an assigned said first computing node as disabled if it fails to send a said status report.

26. The fault-tolerant multi-processor computer system of claim 23 wherein:
(a) each said computing node includes logic for informing a said watch dog node if it fails to complete a communication with another of said computing nodes; and,
(b) said watch dog nodes include logic for sending an extra said test message to said another of said computing nodes to determine if said failure to complete a communication was due to said node's being disabled.

27. The fault-tolerant multi-processor computer system of claim 23 and additionally comprising:
fifth logic means in said load balancing nodes for causing said load balancing nodes to perform the tasks assigned to a said watch dog node when it is disabled using the messages in said first data storage means as necessary.

28. The fault-tolerant multi-processor computer system of claim 27 wherein:
said load balancing nodes include logic for after initialization periodically and continuously sending test messages to each of said watch dog nodes and for treating a said watch dog node as disabled if it fails to respond to a said test message.

29. The fault-tolerant multi-processor computer system of claim 27 wherein:
(a) each said watch dog node includes logic for after initialization periodically and continuously gathering and sending status reports on itself to a said load balancing node to which it is assigned; and,
(b) said load balancing nodes include logic for treating an assigned said watch dog node as disabled if it fails to send a said status report.

30. In a fault-tolerant multi-processor computer system of the hypercube type comprising a plurality of computing nodes and a watch dog node, the improved method of operation comprising the steps of:
(a) connecting a first network of message conducting paths to interconnect the computing nodes as a hypercube and provide a path for message transfer between said computing nodes;
(b) connecting a second network of message conducting paths to directly connect each of the computing nodes to the watch dog node to provide an independent path for test message and reconfiguration affecting transfers between respective ones of the computing nodes and the watch dog node;
(c) employing the first network for all message transfers between the computing nodes; and,
(d) employing the second network for all test message and reconfiguration affecting transfers between respective ones of the computing nodes and the watch dog node.

31. The method of claim 30 wherein the fault-tolerant multi-processor computer system of the hypercube type additionally comprises a plurality of second computing nodes and additionally comprising the steps of:
(a) connecting a third network of message conducting paths to interconnect the second computing nodes as a hypercube to provide a path for message transfer between said second computing nodes;
(b) connecting a fourth network of message conducting paths to directly connect each of the second computing nodes to the watch dog node independent from the third network to provide an independent path for test message and reconfiguration affecting transfers between respective ones of the second computing nodes and the second watch dog node; and,
(c) employing the third network for all message transfers between the second computing nodes;
(d) employing the fourth network for all test message and reconfiguration affecting transfers between respective ones of the second computing nodes and the second watch dog node; and,
(e) disposing first multiplexer means between the first watch dog node and the second and fourth networks to allow the first watch dog node to selectively communicate directly with individual ones of said computing nodes through said second and fourth networks.

32. The method of claim 31 and additionally comprising:
operably connecting a second watch dog node to the first multiplexer means whereby the second watch dog node can selectively communicate directly with individual ones of the computing nodes through the second and fourth networks.

33. The method of claim 32 wherein the fault-tolerant multi-processor computer system of the hypercube type additionally comprises a first load balancing node, and additionally comprising the step of:
connecting second multiplexer means between the first load balancing node and the first and second watch dog nodes to allow the first load balancing node to selectively communicate directly with individual ones of the first and second watch dog nodes.

34. The method of claim 33 and additionally comprising the step of:
sending a copy of each message sent from one of the computing nodes to another of the computing nodes over the first and third network of message conducting paths to the watch dog nodes over the second and fourth networks of message conducting paths.

35. The method of claim 34 and additionally comprising the step of:
sending a copy of each acknowledgment of message handling completion sent from one computing node to another over the first and third networks of message conducting paths to the watch dog nodes over the second and fourth networks of message conducting paths.

36. The method of claim 35 and additionally comprising the step of:
saving the copy of each message received from one of the computing nodes until the associated copy of acknowledgment of message handling completion is received.

37. The method of claim 36 and additionally comprising the step of:
maintaining in each watch dog node a list of the tasks assigned for execution to each of the computing nodes assigned to it.

38. The method of claim 37 and additionally comprising the step of:
after initialization having the watch dog nodes periodically and continuously evaluate the task loading of the computing nodes and reassign tasks from ones of computing nodes which are task overburdened to others of computing nodes which are being under utilized.

39. The method of claim 37 and additionally comprising the step of:
causing the watch dog nodes to perform the tasks assigned to a computing node which is disabled using the messages saved by the watch dog node.

40. The method of claim 39 and additionally including the steps of:
(a) after initialization having the watch dog nodes periodically and continuously send test messages to computing nodes assigned to them; and,
(b) having the watch dog nodes treat a computing node as disabled if it fails to respond to a test message.

41. The method of claim 39 and additionally including the steps of:
(a) after initialization having each first computing node periodically and continuously gather and send status reports on itself to the first watch dog node; and,
(b) having the first watch dog node treat a first computing node as disabled if it fails to send a status report.

42. The method of claim 39 and additionally including the steps of:
(a) having each first computing node inform a watch dog node if it fails to complete a communication with another of the first computing nodes; and,
(b) having the watch dog nodes send an extra test message to a non-completing computing nodes to determine if the failure to complete a communication was due to the node's being disabled.

* * * * *